United States Patent [19]

Den Blanken

[11] Patent Number: 4,973,562
[45] Date of Patent: Nov. 27, 1990

[54] METHOD OF MANUFACTURING A SEMICONDUCTOR DEVICE HAVING INTERCONNECTIONS LOCATED BOTH ABOVE A SEMICONDUCTOR REGION AND ABOVE AN ISOLATION REGION ADJOINING IT

[75] Inventor: Hubertus J. Den Blanken, Eindhoven, Netherlands

[73] Assignee: U.S. Philips Corporation, New York, N.Y.

[21] Appl. No.: 433,470

[22] Filed: Nov. 6, 1989

Related U.S. Application Data

[63] Continuation of Ser. No. 186,529, Apr. 27, 1988, abandoned.

[30] Foreign Application Priority Data

May 1, 1987 [NL] Netherlands ............ 8701032

[51] Int. Cl.$^5$ ............................ H01L 21/283
[52] U.S. Cl. ........................ 437/189; 437/40; 437/59; 437/69; 437/183; 437/190; 437/192; 437/228; 148/DIG. 20; 148/DIG. 105; 357/71
[58] Field of Search ............ 437/200, 190, 228, 192, 437/40, 41, 57, 58, 59, 69, 183, 189; 156/643; 357/71

[56] References Cited

U.S. PATENT DOCUMENTS

| | | |
|---|---|---|
| 4,267,012 | 5/1981 | Pierce et al. ............ 437/192 |
| 4,470,874 | 9/1984 | Bartush et al. ............ 156/643 |
| 4,486,946 | 12/1984 | Jopke, Jr. et al. ............ 437/192 |
| 4,536,951 | 8/1985 | Rhodes et al. ............ 437/190 |
| 4,541,169 | 9/1985 | Bartush ............ 437/228 |
| 4,614,021 | 9/1986 | Hulseweh ............ 437/200 |
| 4,708,767 | 11/1987 | Bril ............ 437/18 |
| 4,789,647 | 12/1988 | Peters ............ 437/190 |
| 4,866,009 | 9/1989 | Matsuda ............ 437/190 |
| 4,873,565 | 10/1989 | Roane ............ 437/191 |

OTHER PUBLICATIONS

Wong, S. et al., "HPSAC-A Silicided . . . ", *IEEE Trans. Elec. Dev.*, vol. ED-34, No. 3, Mar. 1987, pp. 587–592.

Primary Examiner—Brian E. Hearn
Assistant Examiner—T. N. Quach
Attorney, Agent, or Firm—Paul R. Miller

[57] ABSTRACT

A method of manufacturing a semiconductor device, in which a first pattern of conductors (20), an isolating layer (21) and a second pattern of conductors (22) are successively provided on a surface (2) of a semiconductor body (1) adjoined by a number of isolation regions (4, 10) and a number of semiconductor regions (3). Mutual contacts are established between the two patterns (20, 22) and these contacts are located both above a semiconductor region (3) and above an adjoining isolation region (4, 10) by forming conductive pillars (44) in the first pattern (20), exposing a tip (51) of the pillars (44) after an isolating layer (50) has been provided and providing the second pattern (22) over the tip (51) of the pillars (44). Thus, a large amount is saved on the surface (2).

12 Claims, 4 Drawing Sheets

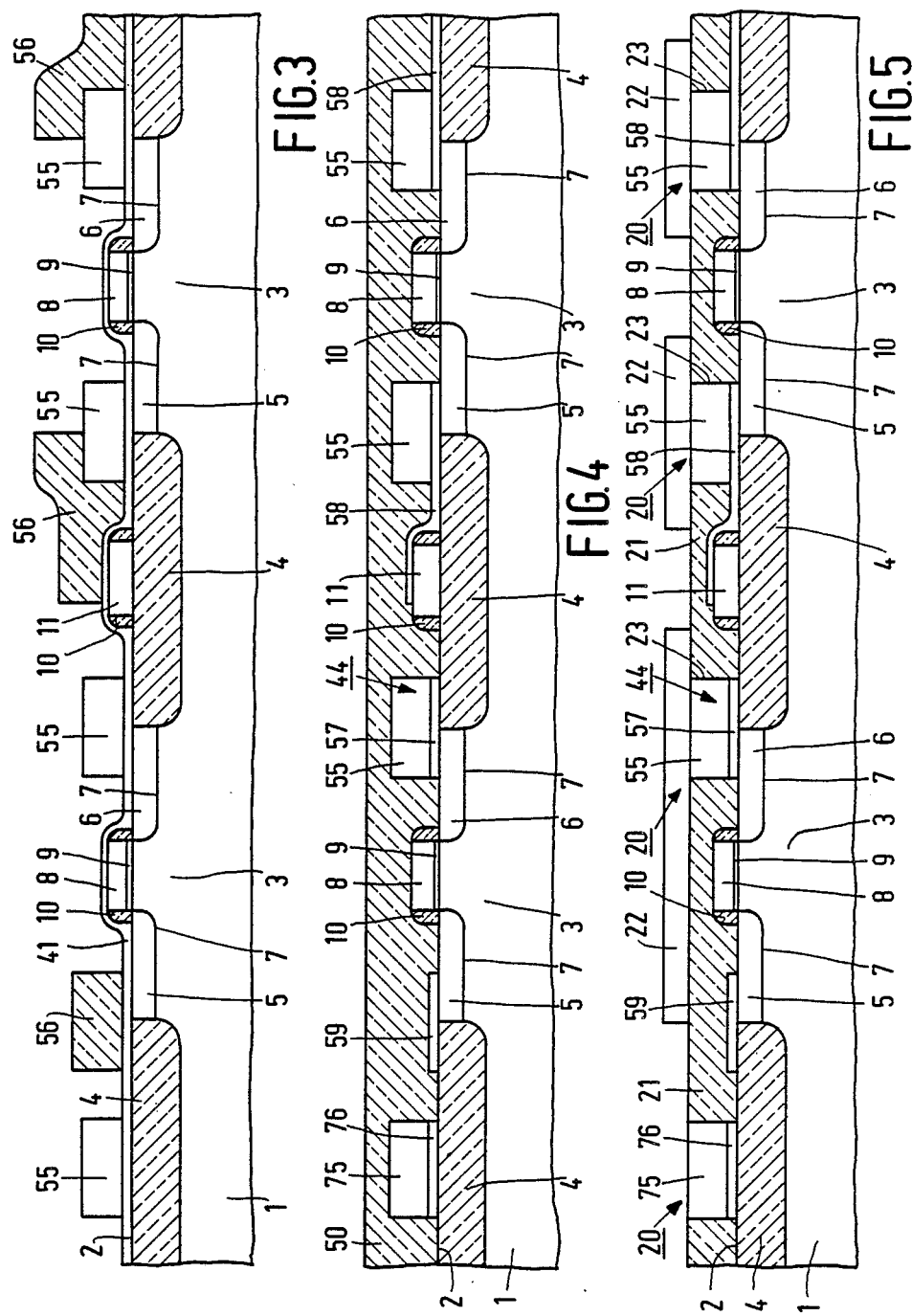

METHOD OF MANUFACTURING A SEMICONDUCTOR DEVICE HAVING INTERCONNECTIONS LOCATED BOTH ABOVE A SEMICONDUCTOR REGION AND ABOVE AN ISOLATION REGION ADJOINING IT

This application is a continuation application of Ser. No. 07/186,529, filed Apr. 27, 1988 now abandoned, and the benefits for such earlier application are hereby claimed for this new continuation application.

The invention relates to a method of manufacturing a semiconductor device, in which a first pattern of conductors, an isolating layer and a second pattern of conductors are successively provided on a surface of a semiconductor body adjoined by a number of isolation regions and a number of semiconductor regions, mutual contacts being locally formed between the two patterns via openings in the isolating layer, which are located both above a semiconductor region and above an isolation region adjoining it. The isolation regions may be field isolation regions provided in the semiconductor body, or also isolation regions which are present on the surface and serve for isolation of, for example, gate electrodes.

BACKGROUND OF THE INVENTION

Through the openings in the isolating layer, interconnections are formed between the two patterns of conductors. The first pattern, which is provided on the surface of the semiconductor body, is locally in contact with semiconductor regions. Through interconnections these semiconductor regions are connected to the second pattern of conductors. Since the interconnections are formed at areas located both above a semicondutor region and above an adjoining isolation region, much space is saved on the surface of the semiconductor body. In practice, openings in the isolating layer, through which the interconnections are established, have dimensions which are determined by the manufacturing process comprising lithographic and etching processing steps. For example, such an opening has a cross-section of $1 \times 1$ $\mu$m. If the interconnections are formed at areas located only above semiconductor regions, these semiconductor regions must have dimensions which are larger than those of the openings in the isolating layer If the interconnections are formed at areas located both above a semiconductor region and above an adjoining isolation region, the openings are consequently present only in part above the semiconductor regions so that these semiconductor regions can be considerably smaller. In the first case, the semiconductor regions must have, for example, a surface area of about $2 \times 2$ $\mu$m, while in the second case they can have a considerably smaller surface area.

From the article "A New Device Interconnect Scheme for Submicron VLSI" by D. C. Chen et al. Technical Digest of the International Electron Devices Meeting, 1984, p. 118-121, a method is known of the kind mentioned in the opening paragraph, in which the mutual contacts are present at areas which are located both above semiconductor region and above a field isolation region. These contacts between the first and second patterns of conductors are established by etching into the isolating layers windows terminating on the first pattern of conductors and by providing the second pattern of conductors over the windows thus formed.

In the known method, in which both the isolating layer and the field isolation regions consist of silicon oxide, the first pattern of conductors serves as an etching stopper when etching the window. As a result, the yield oxide is protected during etching at the areas at which the window is formed. If this should not be the case, after etching the window into the isolating layer of silicon oxide, the field oxide is also etched. If the etching process is not stopped in time, the field oxide can locally be etched away entirely. After the second pattern of conductors has been provided, a pn junction terminating on the field oxide would be shortcircuited. Especially in those cases in which the pn junction extends comparatively closely to the surface of the semiconductor body, it is difficult to stop the etching process in time. This is certainly the case in semiconductor devices in which semiconductor regions, field isolation regions, conductors and contact windows having dimensions in the micron and the submicron range must be realized.

In the known method described, the first pattern of conductors serves as an etching stopper when etching the windows into the isolating layer. At the area of each window, for this purpose a part of the first pattern should be present having a surface area larger than the surface area of the cross-section of the window. In order to prevent the undesired etching of the field isolation region described above, this surface area must be at least so large that, when the window is formed, the etching stopper is present under all circumstances when etching the window. The window is defined by a photolithographic mask which is imaged on a layer of photoresist provided on the surface of the semiconductor body. After development, an opening of, for example, $1 \times 1$ $\mu$m is formed in the photoresist. Subsequently, the window is etched while using the remaining photoresist as a mask. Since the photolithographic mask is imaged with a given alignment tolerance (of about $\pm 0.3$ $\mu$m), the window mostly does not exactly arrive at its place. It is only certain that it arrives at an area which is as large as the mask extended with an edge equal to the alignment tolerance. In the embodiment with a window of $1 \times 1$ $\mu$m, this is consequently an area of $1.6 \times 1.6$ $\mu$m. If the part of the first pattern of conductors serving as an etching stopper when forming the window is provided by a similar photolithographic method, in which similar tolerances play a part, this part must have a surface area as large as the area at which the window is formed plus a strip having a width equal to the alignment tolerance. In the embodiment, this is consequently a square of $2.2 \times 2.2$ $\mu$m. This requires on the surface a space which is again larger by the same amount. In the embodiment, this is consequently $2.8 \times 2.8$ $\mu$m. For a window of $1 \times 1$ $\mu$m, an etching stopper of $2.2 \times 2.2$ $\mu$m must therefore be present, for which purpose a space of $2.8 \times 2.8$ $\mu$m must be reserved on the surface of the semiconductor body.

SUMMARY OF THE INVENTION

The invention has inter alia for its object to provide a method, in which it is possible to establish an electrical connection also between the first and the second pattern of electrical conductors without isolation regions also being etched or damaged in an undesired manner, in which event the first pattern need have only a minimum surface area at the area of the opening in the isolating layer, while only a minimum amount of space is required on the surface of the semiconductor body.

According to the invention, for this purpose the method of the kind mentioned in the opening paragraph is characterized in that the mutual contacts are established by forming in the first pattern of conductors conducting pillars, exposing a tip of the pillars after the isolating layer has been provided and providing the second pattern over the exposed tip of the pillars.

The pillar has dimensions which correspond to a mask used when forming the pillar by means of photolithographic and etching techniques. If the same mask as described above is used, the pillar has a cross-section of $1 \times 1$ μm. Since this pillar is made of material other than that of the semiconductor body and of the isolation region, it can be etched substantially without the semiconductor material and the isolation material being attacked. The isolation region may be a field isolation region provided in the semiconductor body, but also an isolation region which is present on the surface to serve, for example, to isolate a gate electrode. An etching stopper in the formation of a pillar is not necessary. Only a space which is larger by a strip having a width equal to the alignment tolerance need be provided for this purpose on the surface of the semiconductor body. In the embodiment, this is consequently a space of $1.6 \times 1.6$ μm. If a part of $0.5 \times 1$ μm thereof is disposed on the semiconductor region, a satisfactory contacting thereof is ensured.

A preferred embodiment of the method according to the invention is characterized in that the first pattern of conductors is formed in a double layer comprising a base layer and a top layer of mutually selectively etchable materials, the pillars being formed in the top layer and subsequently the base layer being etched, in which event the pillars are used as an etching mask.

Various patterns can be etched into the base layer. For example, the pillars may be imaged, as it were, in the base layer. Alternatively, conductor tracks may be formed in the base layer, in which event the pillars join in a self-registered manner. In the latter case, a conductor track having a width equally larger as or even narrower than the pillar can directly adjoin the pillar. Further, conductor tracks may be formed in the base layer, which do not adjoin a pillar but which, for example, extend over a field oxide region and interconnect two adjoining semiconductor regions.

In practice, the pillars and the remaining conductor tracks can be formed very suitably in the double layer if the base layer mainly consists of tungsten and the top layer mainly consists of aluminium. For example about 10% by volume of titanium is added to the tungsten and, for example, about 0.5% by volume of silicon is added to the aluminium. Other additions in small quantities are also possible.

BRIEF DESCRIPTION OF THE DRAWINGS

The invention will now be described more fully, by way of example, with reference to a drawing. In the drawing:

FIG. 1 to FIG. 5 show diagrammatically and in cross-section a few successive stages of manufacture of a semiconductor device by means of the method according to the invention.

DESCRIPTION OF THE INVENTION

Figures 1, 2:
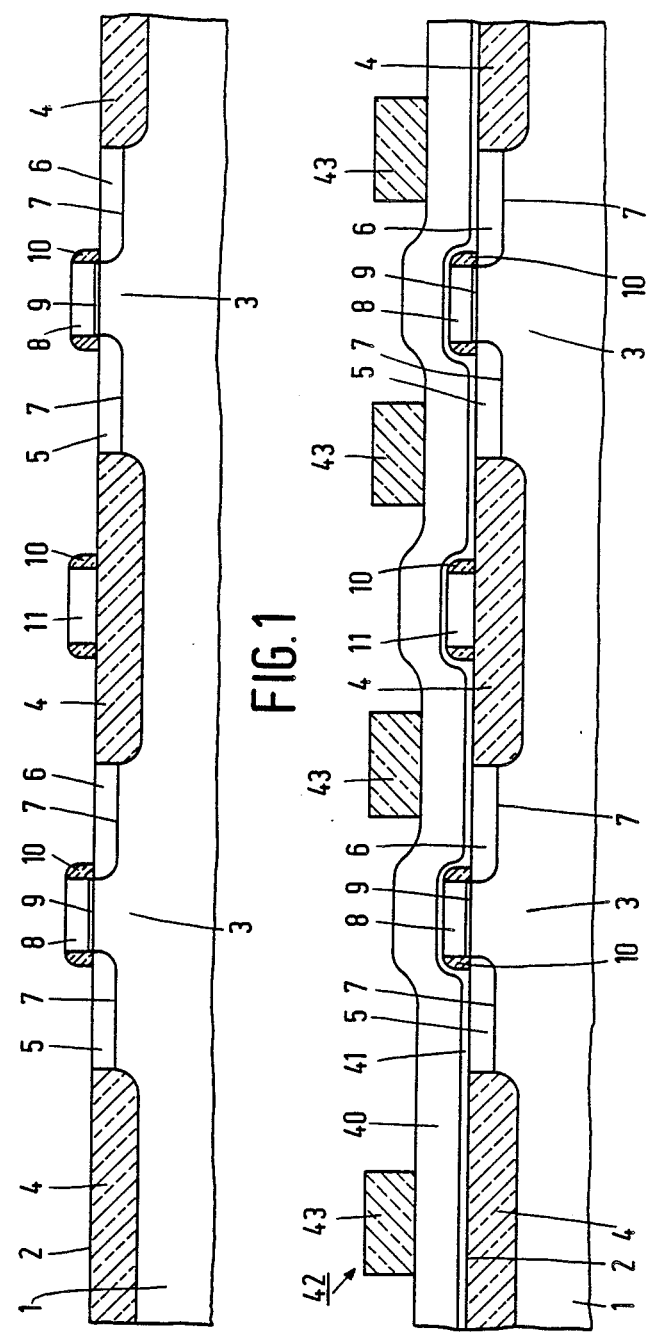

FIGS. 1 to 5 show diagrammatically and in cross-section a few successive stages of manufacture of a semiconductor device by means of the method according to the invention. The starting material is a semiconductor body 1 of silicon of the n-conductivity type having a surface 2, which is adjoined by a number of semiconductor regions 3, which are isolated from each other by field isolation regions 4. In the drawing, two of these regions are shown; however, it will be appreciated that a semiconductor device can comprise in practice a very large number of such regions. The field isolation regions 4 consist of silicon oxide which can be obtained by local oxidation of silicon. Grooves etched into the semiconductor body 1 may also be filled with silicon oxide. The semiconductor regions 3 comprise a source zone 5 and a drain zone 6 of a field effect transistor. Both zones 5, 6 are of the p-conductivity type and form in the semiconductor region 3 with the D-type material present there a pn junction 7, which extends at a distance of about 0.3 μm from the surface 2. A gate electrode 8 of conductive polycrystalline silicon is provided on the surface 2, this gate electrode being disposed on a layer of gate oxide 9 having a thickness of about 20 nm and being laterally isolated by edges 10 of silicon oxide. Further, the surface 2 is provided, for example, with a conductor 11 of conductive polycrystalline silicon, which is also laterally isolated by edges 10 of silicon oxide.

As will be described in detail hereinafter, a first pattern of conductors 20, an isolating layer 21 and a second pattern of conductors 22 are provided on the surface 2 (cf. FIG. 5). The isolating layer 21 consists of silicon oxide, which is obtained, for example, by heating the semiconductor body 1 at 400° C. in an atmosphere of silane and oxygen.

Mutual contacts are locally formed between the two patterns of conductors 20 and 22 through openings 23 in the isolating layer. These openings 23 are located both above a semiconductor region 3 and above an adjoining field isolation region 4, as a result of which the space on the surface is utilized very efficiently. In practice, the openings 23 in the isolating layer 21 have dimensions which are determined by the manufacturing process comprising photolithographic and etching processing steps. Such an opening has a cross-section of, for example, $1 \times 1$ μm. If such an opening is formed by etching a window of these dimensions into the isolating layer 21, this opening must not be present above the field isolation region 4. When etching such a window into the layer 21 consisting of silicon oxide, the subjacent silicon oxide of the field isolation region 4 would then also be etched. If the etching process is then not stopped in time, the field isolation region 4 can be locally etched away in part. The shallow pn junction 7 could then be shortcircuited after the formation of the second pattern of conductors. If the opening 23 should be formed in this manner, the semiconductor region 3 would have to be so large that the silicon always can serve as an etching stopper when etching the silicon oxide. This means that this region, if the opening has a cross-section of $1 \times 1$ μm and if this opening can be formed within a tolerance of ±0.3 μm at a desired area, must have a surface area of at least $1.6 \times 1.6$ μm or rather a surface area of about $2 \times 2$ μm. If this opening 23 may indeed be located in part above the field isolation region 4, as will appear, the semiconductor region 3 can be considerably smaller.

Figure 6:
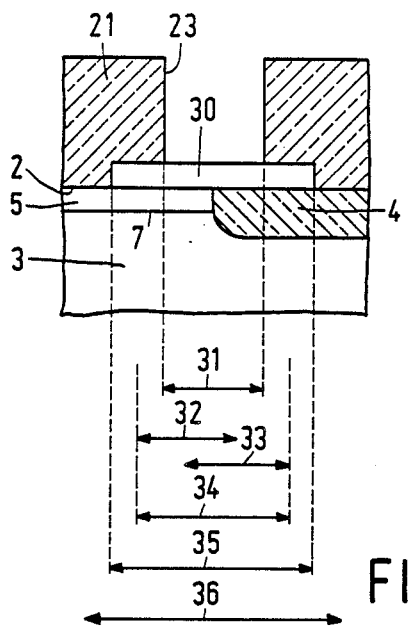
FIGS. 6 and 7 show diagrammatically an interconnection between a first and a second pattern of conductors formed by means of a known method.

From the article "A New Device Interconnect Scheme for Submicron VLSI" by D. C. Chen et al, Technical Digest of the International Electron Devices Meeting 1984, p. 118–121, a method is known, in which the opening 23 is indeed present in part above the field oxide 4 and this opening is formed by etching a window into the isolating layer 21 without the aforementioned risk occurring that the field isolation region 4 is etched in an undesired manner (cf. FIG. 6). In this known method, a part 30 of the first pattern of conductors serves as an etching stopper when etching the opening 23 into the isolating layer 21. As a result, the subjacent field isolation region 4 is protected. However, the part 30 should for this purpose have a surface area which is considerably larger than the cross-section of the opening 23. It must be so large that, when forming the opening 23, the etching stopper is present under all conditions during etching.

The dimensions of the opening are determined bY the dimensions of a photolithographic mask imaged on a layer of photoresis.t After development, an opening of, for example, $1 \times 1$ μm is then formed therein. Subsequently, a window is etched into the isolating layer 21 while using the remaining photoresist as a mask. The window than also has a cross-section of $1 \times 1$ μm indicated by a bar 31. Since the photolithographic mask is imaged with a certain alignment tolerance of about ±0.3 μm, the opening 23 mostly arrives at its place during growing, but it can be displaced to all sides over a distance of 0.3 μm, which is indicated diagrammatically by bars 32 and 33. It is certain only that the opening arrives at a place indicated by a bar 34, which exceeds the $1 \times 1$ μm by an edge having a width of 0.3 μm. This area 34 consequently has dimensions of $1.6 \times 1.6$ μm.

The part 30 of the first pattern of conductors serving here as etching stopper is obtained in a similar manner by photolithographic and etching processing steps, an alignment tolerance of about ±0.3 μm then also playing a part. The part 30 therefore must have a cross-section indicated by a bar 35, which exceeds the area 34 by an edge having a width of 0.3 μm. A surface area of $2.2 \times 2.2$ μm is therefore required. For this purpose, on the surface 2 an area indicated by a bar 36 must be reserved, which is again by such an edge larger, i.e. an area of $2.8 \times 2.8$ μm.

In the method according to the invention, the mutual contacts between the first pattern of conductors 20 and the second pattern of conductors 22 are established by forming in the first pattern of conductors 20 conductive pillars, exposing a tip of the pillars after an isolating layer has been provided and providing the second pattern 22 over the exposed tip of the pillars This is effected in that the surface 2 of the semiconductor body 1 (cf. FIGS. 2 and 3) is covered by an electrically conducting layer, in this embodiment a double layer comprising a base layer 41 and a top layer 40, of which the particular advantages will be described hereinafter. In a usual manner, a photoresist mask 42 is provided on this layer 40, 41. The photoresist mask 42 comprises a number of parts 43 having a cross-section of $1 \times 1$ μm. Subsequently, the electrically conducting layer 40, 41 is etched while using the photoresist mask 42 as a mask, pillars then being formed.

Figure 8:
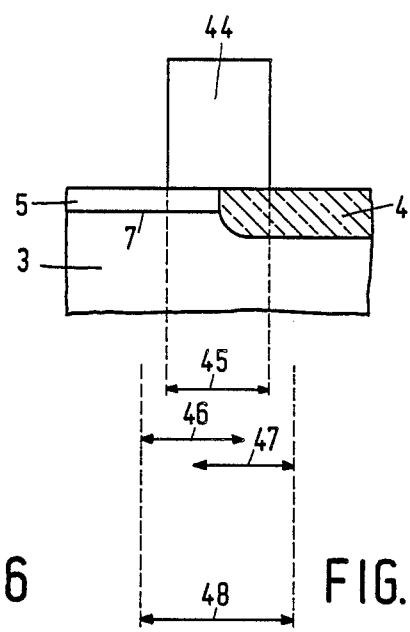
FIGS. 8 and 9 show diagrammatically an interconnection between a first and a second pattern of conductors formed by means of the method according to the invention.

FIG. 8 shows such a pillar 44, which is etched both into the top layer 40 and into the base layer 41. The separate layers are not shown in the drawing for the sake of clarity. The pillar 44 has a cross-section corresponding to that of the part 43 of the photoresist mask. i.e. a cross-section of $1 \times 1$ μm indicated diagrammatically by a bar 45. The conductive layer 40, 41 may be made of such a material that the pillar 44 can be etched so that the field isolation region 4 and the semiconductor region 2 are substantially not attacked. An etching step is then not required. Since the etching mask 43 is provided with a certain alignment tolerance of about ±0.3 μm, the pillar 44 can arrive at the surface 2 so as to be displaced over a distance of 0.3 μm at all sides, so far as indicated diagrammatically by bars 46 and 47.

Therefore, a space must be reserved on the surface 2 having a suface area as indicated by a bar 48, which is equal to the cross-section of the pillar 4 plus an edge having a width of 0.3 μm. Consequently, this is a space of $1.6 \times 1.6$ μm. It should be noted that the space that had to be reserved on the surface in order to establish a similar interconnection by the known method (cf. FIG. 6) had dimensions of $2.8 \times 2.8$ μm.

Figure 10:
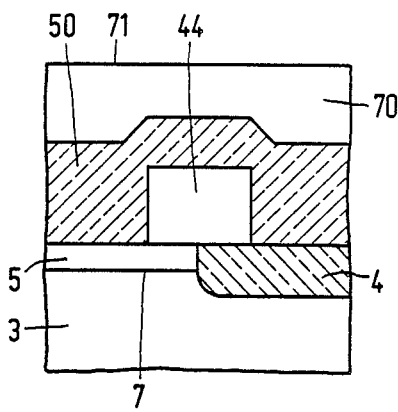
FIGS. 10, 11, 12 and 13 show in greater detail a few stages as shown in FIGS. 1 to 5, and FIGS. 14 and 15 show a few variations of the interconnections shown in FIG. 5.
Figure 11:
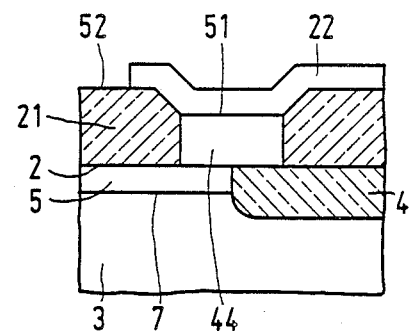
Figure 12:
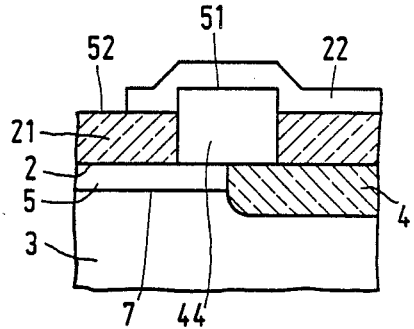
Figure 13:
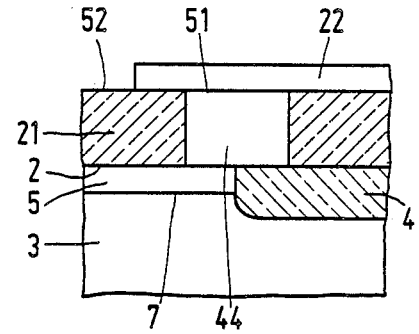

After the pillars 44 have been formed, the surface 2 is covered by an isolating layer 50 by heating the semiconductor body 1 at 400° C. in an atmosphere of silane and oxygen, a layer of silicon oxide then being formed This layer of silicon oxide 50 covers at the same time the pillars 44 (cf. FIG. 10). Subsequently, the layer 50 is etched so that the ultimate isolating layer 21 is formed and that a tip 51 of the pillars 44 is exposed (cf. FIGS. 11, 12 and 13). This may be effected so that the layer 21 has a surface 52 which is located at a higher level than the tip 51 of the pillar 44 (FIG. 11), which is located at a lower level than the tip 51 (FIG. 12) or which is located at the same level as the tip 51 of the pillar 44 (FIG. 13). The second pattern of conductors 22 is provided on the surface 52, this pattern being disposed over the tip 51 and being in electrical contact therewith.

The first pattern of conductors 20 is formed in a double layer comprising a base layer 41 and a top layer 40 of mutually selectively etchable materials. By means of the etching mask 42 with the photoresist parts 43, first pillars 55 are formed in the top layer 40. After a second photoresist mask 56 has been provided in a usual manner, the base layer 41 is etched. Thus, various patterns can be etched into the base layer 41. For example, the pillars 55 can be imaged, as it were, in the base layer, parts 57 then being formed. In these cases, the base layer does not fullfil any function and could equally well have been omitted. FIG. 4 shows as an example thereof the pillar 44 as described with reference to FIGS. 8 to 13. With the remaining pillars 55 in FIG. 4, a conductor track 58 is formed in the base layer 41, the pillars being joined in a self-registered manner. The pillar 55 is used during etching of the conductor tracks 58 as an etching mask joining the etching mask 56. FIG. 4 shows two of such situations, in one of which the conductor 58 is in contact with the conductor 11 of polycrystalline silicon disposed on the surface 2. FIG. 4 further shows a conductor 59, which is formed only in the base layer and connects the subjacent source zone 5 to a point (not shown) located elsewhere in the semiconductor body.

Figure 7:
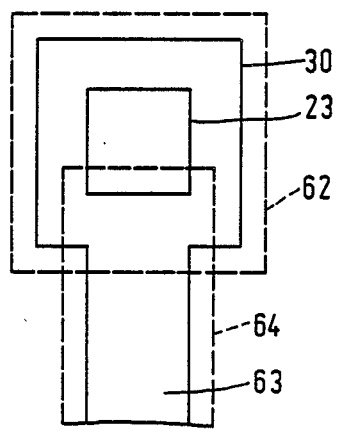
Figure 9:
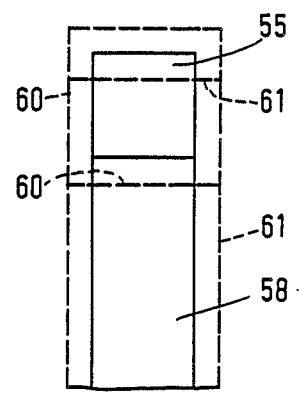

FIG. 9 is a plan view of a situation in which the pillar 55 is formed in the top layer 40 and joins the conductor track 58 formed in the base layer 41. For the pillar 55 a space must be reserved on the surface 2, which space is indicated by the dotted line 60 and, as described above, has dimensions of 1.6×1.6 μm. For the conductor track 58 having, for example, a width of 1 μm, a space must be reserved for the same reason as with the pillar, which space is indicated by a dotted line 61 and is constituted by a strip having a width of 1.6 μm. For comparison, FIG. 7 shows a comparable situation, in which the connection between the two patterns is obtained in known manner. For the part 30 of the second pattern, above which the window 23 was situated, a space indicated by a dotted line 62 of 2.8×2.8 μm had to be reserved. For an adjoining conductor 63, a space had to be reserved indicated by a dotted line 64 and constituted by a strip having a width of 1.6 μm. It appears from FIG. 7 and 9 that, when forming the first conductor pattern 20, during which process the pillars 55 are connected to the conductors 57 formed in the base layer 41, as is the case in the method according to the invention, a large amount of space is saved.

The first pattern of conductors 20 is formed in accordance with the invention in a double layer comprising a base layer 41 mainly consisting of tungsten and a top layer 40 mainly consisting of aluminium. For example about 10% by volume of titanium is added to the tungsten and, for example 0.5% by volume of silicon is added to the aluminium. Other additions, such as nitrogen in tungsten and copper in aluminium, are also possible. The aluminium is selectively etchable with respect to the tungsten in a chlorine-containing plasma (for example in a plasma of CCl$_4$ and Cl$_2$), after which the tunqsten is selectively etchable with respect to silicon and silicon compounds in a buffered peroxide solution.

Preferably, when the tip 51 of the pillars 44, 55 is exposed, the isolating layer 50 (cf. FIGS. 10, 12 and 13) is etched so that this layer 21 has after etching a substantially smooth surface 52, which substantially coincides with or is located at a lower level than the tip 51 of the pillars 44, 55 This may be obtained, for example, by providing on top of the layer 50 a resist layer 70, which has a planar surface 71, and by subsequently subjecting the semiconductor body to an etching treatment, in which the resist layer 70 and the isolating layer 50 are etched substantially at the same rate. The second pattern of conductors 22 can then be provided on a substantially planar surface 52, which is much simpler than on a non-planar surface.

The process of providing a resist layer 70 on a planar surface 71 is considerably facilitated by forming on the surface 2 of the semiconductor 1 a number of dummy pillars 75 in the first pattern of conductors 20, in such a manner that, viewed over the surface 2, a substantially regular distribution of pillars is obtained. Thus, great differences in surface topography are avoided, as a result of which it is achieved that the isolating layer 50 will also exhibit less strongly pronounced differences in surface topography. After the resist layer 70 has been provided, the latter will have a considerably more planar surface than if it were provided on a surface having a larger surface topography.

After the second pattern of conductors 22 has been provided, the assembly is covered again by a second isolating layer with, as the case may be, a third pattern of conductors contacting the second pattern through openings in the second isolating layer. This is not shown in the drawing for the sake of clarity.

It will be appreciated that the invention is not limited to the embodiment described, but that within the scope of the invention many further variations are possible. For example, the source zones 5, the drain zones 6, the gate electrodes 8 and the additional conductors 11 may be provided at their surface in a usual manner, before the conductive double layer 40, 41 is formed, with a silicide layer, for example, by covering the surface 2 with a layer of titanium, carrying out a heat treatment and etching away the non-reacted titanium.

Figure 14:
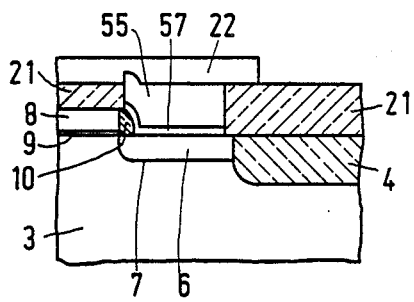
Figure 15:
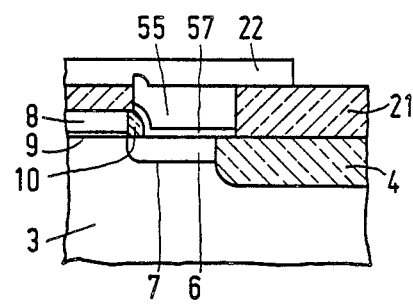

It has been described above that the interconnections were established via pillars 44 at areas located both above field oxide regions 4 and above semiconductor regions 3. While maintaining the advantage of saving space, these interconnections may also be established at areas located both above semiconductor regions 3 and above other isolation regions, such as, for example, the isolation region 10 serving as isolation of the gate electrode 8 (cf. FIG. 14). A very large amount of space is saved if the interconnection is established at an area located both above the semiconductor region 3 and above the field oxide region 4 as well as above the isolation region 10 (cf FIG. 15).

What is claimed is:

1. A method of manufacturing a semiconductor device comprising the steps of
   (a) forming a plurality of semiconductor regions at a surface of a semiconductor body,
   (b) separating each of said plurality of semiconductor devices by field isolation regions at said surface,
   forming a layer of conductive material over said surface in contact with said semiconductor regions and with said field isolation regions, said layer of conductive material including a base layer in contact with said surface and a top layer in contact with said base layer, said base layer and said top layer being formed of different conductive materials,
   (d) masking said first layer of conductive material with a mask having a number of mask parts with a cross-section of 1×1 μm$^2$,
   (e) etching a plurality of conductive pillars from said top layer of conductive material, said plurality of conductive pillars being formed respectively to contact portions of said semiconductor regions, portions of said field isolation regions, and portions of both said semiconductor regions and adjacent field isolation regions, each of said plurality of conductive pillars being formed below said mask parts with a minimum space on said surface of said semiconductor body,
   (f) etching said base layer of conductive material to form conductive contacts between said conductive pillars and portions of said semiconductor regions,
   (g) covering said surface of said semiconductor body with an isolating layer, said isolating layer being formed over said conductive pillars, said conductive contacts, said semiconductor region regions, and said field isolation regions, said isolating layer having a thickness covering said plurality of conductive pillars,
   (h) etching said isolating layer to expose tips of said conductive pillars, and
   (i) forming another layer of conductive material on said isolating layer to contact said conductive pillars.

2. A method according to claim 1, wherein said base layer and said top layer are mutually selectively etchable materials, and wherein said conductive contacts are formed in said step (f) by etching said base layer using said plurality of conductive pillars as an etching mask.

3. A method according to claim 2, wherein said base layer mainly consists of tungsten, and said top layer mainly consists of aluminium.

4. A method according to claim 1 or claim 2 or claim 3, wherein said step (h) is carried out by etching said isolating layer to expose said tips of said conductive material such that said isolating layer has a substantially planar surface located from said surface at the same height as or at a lower height than said tips of said conductive pillars.

5. A method according to claim 4, wherein a portion of said plurality of conductive pillars are formed in step (e) as dummy pillars, said dummy pillars being formed with remaining ones of said plurality of conductive pillars over said surface to provide a substantially regular distribution of said plurality of conductive pillars.

6. A method according to claim 5, wherein said plurality of conductive pillars are formed with a cross-section of $1 \times 1$ $\mu m^2$, and wherein said minimum space for said semiconductor regions is only an area of $1.6 \times 1.6$ $\mu m^2$ for said conductive pillars.

7. A method according to claim 6, wherein said plurality of conductive pillars are formed of materials different from material of said semiconductor body and said of isolating layer.

8. A method according to claim 4, wherein said plurality of conductive pillars are formed with a cross-section of $1 \times 1$ $\mu m^2$, and wherein said minimum space for said semiconductor regions is only an area of $1.6 \times 1.6$ $\mu m^2$ for said conductive pillars.

9. A method according to claim 1 or claim 2 or claim 3, wherein said plurality of conductive pillars are formed with a cross-section of $1 \times 1$ $\mu m^2$, and wherein said minimum space for said semiconductor regions is only an area of $1.6 \times 1.6$ $\mu m^2$ for said conductive pillars.

10. A method according to claim 9, wherein said plurality of conductive pillars are formed of materials different from material of said semiconductor body and said of isolating layer.

11. A method according to claim 1 or claim 2 or claim 3, wherein said step (f) is carried out by both using said plurality of conductive pillars as a second mask and forming additional masking areas.

12. A method according to claim 1 or claim 2 or claim 3, wherein said step (a) is carried out by forming source regions, drain regions, and insulated gate regions, and wherein at least a portion of said plurality of conductive pillars contact said source regions, said drain regions and said insulated gate regions at least through said conductive contacts.

* * * * *